United States Patent
Rose et al.

(10) Patent No.: US 8,148,627 B2
(45) Date of Patent: Apr. 3, 2012

(54) SOLAR CELL INTERCONNECT WITH MULTIPLE CURRENT PATHS

(75) Inventors: Douglas H. Rose, Mountain View, CA (US); Shandor G. Daroczi, Santa Clara, CA (US); Neil Kaminar, Santa Cruz, CA (US)

(73) Assignee: SunPower Corporation, San Jose, CA (US)

(*) Notice: Subject to any disclaimer, the term of this patent is extended or adjusted under 35 U.S.C. 154(b) by 644 days.

(21) Appl. No.: 11/895,640

(22) Filed: Aug. 23, 2007

(65) Prior Publication Data

US 2010/0144218 A1 Jun. 10, 2010

Related U.S. Application Data

(60) Provisional application No. 60/840,166, filed on Aug. 25, 2006.

(51) Int. Cl.
*H01L 31/05* (2006.01)
(52) U.S. Cl. ........................................... 136/244
(58) Field of Classification Search ................... None
See application file for complete search history.

(56) References Cited

U.S. PATENT DOCUMENTS

| | | | |
|---|---|---|---|
| 4,321,418 A | 3/1982 | Dran et al. | |
| 4,927,770 A | 5/1990 | Swanson | |
| 5,011,544 A | 4/1991 | Gaddy et al. | |
| 5,053,083 A | 10/1991 | Sinton | |
| 5,100,808 A | 3/1992 | Glenn | |
| 5,164,019 A | 11/1992 | Sinton | |
| 5,185,042 A | 2/1993 | Ferguson | |
| 5,360,990 A | 11/1994 | Swanson | |
| 5,369,291 A | 11/1994 | Swanson | |
| 5,468,652 A | 11/1995 | Gee | |
| 5,660,646 A | 8/1997 | Kataoka et al. | |
| 5,972,732 A | 10/1999 | Gee et al. | |
| 6,274,402 B1 | 8/2001 | Verlinden et al. | |
| 6,313,395 B1 * | 11/2001 | Crane et al. | 136/244 |
| 6,315,575 B1 | 11/2001 | Kajimoto | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 7,148,774 B1 | 12/2006 | Shea et al. | |
| 7,154,361 B2 | 12/2006 | Babu et al. | |
| 7,161,105 B2 | 1/2007 | Sabisch | |
| 2002/0059952 A1 | 5/2002 | Shimada | |
| 2003/0029036 A1 | 2/2003 | Gerson | |
| 2003/0034062 A1 * | 2/2003 | Stern et al. | 136/244 |

(Continued)

OTHER PUBLICATIONS

DSP56F80x in Power Line Modem Applications, 6 sheets, 2004-2006 Freescale Semiconductor, Inc., webpage [online] [retrieved on Nov. 20, 2006]. Retrieved from the internet: http://www.freescale.com/webapp/sps/site/application.jsp?nodeid=023Z1Dj0Tcf5hr.

(Continued)

*Primary Examiner* — Alexa Neckel
*Assistant Examiner* — Shannon Gardner
(74) *Attorney, Agent, or Firm* — Okamoto & Benedicto LLP

(57) ABSTRACT

Solar cell interconnects with multiple current paths. A solar cell interconnect may include a plurality of in-plane slits arranged in several rows. The in-plane slits may be spaced to provide strain relief without unduly increasing the electrical path resistance through the solar cell interconnect. The in-plane slits may be staggered, for example.

7 Claims, 10 Drawing Sheets

U.S. PATENT DOCUMENTS

2004/0040593 A1     3/2004    Ho et al.
2005/0268959 A1*   12/2005   Aschenbrenner et al. .... 136/244
2006/0085167 A1     4/2006    Warfield et al.

OTHER PUBLICATIONS

OFDM Power Line Modem—Block Diagram, 2 sheets, 1995-2006 Texas Instruments Incorporated, webpage [online] [retrieved on Nov. 20, 2006]. Retrieved from the internet: http://focus.ti.com/vf/docs/blockdiagram.tsp?family=vf&blockDiagramId=6054.

E-T-A Circuit Breakers, E-1048-800 Smart Circuit Breaker, "E-T-A Announces Remote Power Controller utilizing Smart Circuit Breaker Technology", Feb. 23, 2004, 3 sheets, The National Design Engineering Show, Chicago, U.S.A.

Trishan Esram and Patrick L. Chapman, "Comparison of Photovoltaic Array Maximum Power Point Tracking Techniques", 11 sheets, [retrieved on Feb. 28, 2007] [Retrieved from the internet: <http://energy.ece.uiuc.edu/chapman/papers/EC%202006%20in%20press.pdf>.

Richard A. Cullen, "Maximum Power Point Tracking", pp. 1-5, [retrieved on Feb. 24, 2007] [Retrieved from the internet: <http://www.earthtoys.com/emagazine.php?issue_number=03.02.01&article=power_point_tracking>.

Wind&Sun Electricity From The Sun, Maximum Power Point Tracking, pp. 1-7, [retrieved on Feb. 24, 2007] [Retrieved from the internet: <http://www.wind-sun.com/Charge_Controls_Meters/PPT.htm>.

W.P. Mulligan, et al., "A Flat-Plate Concentrator: Micro-Concentrator Design Overview", 2000, 3 sheets; Proceedings of the $28^{th}$ IEEE PVSC.

Keith R. McIntosh, et al., "The Choice of Silicon Wafer for the Production of Low-Cost Rear-Contact Solar Cells", May 2003, 4 sheets; Sunnyvale, California.

P.J. Verlinden, et al., "Will We Have a 20%-Efficient (PTC) Photovoltaic System?", 2001, 6 sheets; Proceedings of the $17^{th}$ Europe Photovoltaic Solar Energy Conference.

William P. Mulligan, et al., "Development of Chip-Size Silicon Solar Cells", 2000, 6 sheets; Proceedings of the $28^{th}$ IEEE PVSC.

Akira Terao, et al., "A Mirror-Less Design for Micro-Concentrator Modules", 2000, 4 sheets; Proceedings of the $28^{th}$ IEEE PVSC.

P.J. Verlinden, et al., "Backside-Contact Silicon Solar Cells with Improved Efficiency for the '96 World Solar Challenge", 1997, 5 sheets; Proceedings of the $15^{th}$ EPSEC.

P.J. Verlinden, et al., "One-Year Comparison of a Concentrator Module with Silicon Point-Contact Solar Cell to a Fixed Flat Plate Module in Nothern California", 2000, 4 sheets; Proceedings of the $16^{th}$ EPSEC.

Richard M. Swanson, "The Promise of Concentrators", 2000, pp. 93-111, Progress in Photovoltaics: Research and Applications.

"Flipper Turbot Build Sheet", [retrieved on Apr. 25, 2007], 4 pages, Retrieved from the internet website <http://www.jwgoerlich.solarbnotics/flipper/build_sheet.htm>., illustrating work completed in Oct. 2003.

"Flipper" [retrieved on Apr. 25, 2007], 1 pg., Retrieved from the internet website <http://jwgoerlich.solarbotics.net/robots/flipper/default.htm>., illustrating work completed in Oct. 2003.

D.M.Considine, Ed., "Van Nostrand's Scientific Encyclopedia", New York: Van Nostrand Reinhold, 1989, p. 1096.

C.W. Paul, "Hot-Melt Adhesives", MRS Bulletin, Jun. 2003, pp. 440-444.

Archive.org website, "The Glue Store—Adhesives 101", retrieved on Apr. 27, 2007, 6 pages, [Retrieved from the internet: <http://www.glue-store.com/adhesives101.html>.

Archive.org website, "CSE Distributors PVC Tape", retieved on Apr. 25, 2007, 2 pages, [Retrieved from the internet: <http://www.csedistributors.com/acatalog/PVC_Tape.html>.

* cited by examiner

DETAIL A

SOLAR CELL INTERCONNECT WITH MULTIPLE CURRENT PATHS

REFERENCE TO RELATED APPLICATION

This application claims the benefit of U.S. Provisional Application No. 60/840,166, filed on Aug. 25, 2006, entitled "SOLAR CELL INTERCONNECT WITH MULTIPLE CURRENT PATHS," which is incorporated herein by reference in its entirety.

BACKGROUND OF THE INVENTION

1. Field of the Invention

The present invention relates generally to solar cells, and more particularly but not exclusively to methods and structures for interconnecting solar cells in a solar cell array.

2. Description of the Background Art

Solar cells are well known devices for converting solar radiation to electrical energy. They may be fabricated on a semiconductor wafer using semiconductor processing technology. Generally speaking, a solar cell may be fabricated by forming P-type and N-type diffusion regions in a silicon substrate. Solar radiation impinging on the solar cell creates electrons and holes that migrate to the diffusion regions, thereby creating voltage differentials between the diffusion regions. In a back side contact solar cell, both the diffusion regions and the metal grids coupled to them are on the back side of the solar cell. The metal grids allow an external electrical circuit to be coupled to and be powered by the solar cell. Back side contact solar cells are also disclosed in U.S. Pat. Nos. 5,053,083 and 4,927,770, which are both incorporated herein by reference in their entirety.

Several solar cells may be electrically connected together to form a solar cell array. In a solar cell array, a conductive area coupled to a P-type diffusion region (hereinafter "positive pad") of one solar cell is electrically connected to a conductive area coupled to an N-type diffusion region (hereinafter "negative pad") of an adjacent solar cell. The positive pad of the adjacent solar cell is then electrically connected to a negative pad of a next, adjacent solar cell and so on. This chaining of solar cells may be repeated to connect several solar cells in series to increase the output voltage of the solar cell array. Back side contact solar cells have been connected together using a relatively long, single strip of perforated conductive material. U.S. Pat. No. 6,313,395, which is incorporated herein by reference in its entirety, also discloses the interconnection of several back side contact solar cells to form a solar cell array.

SUMMARY

In one embodiment, a solar cell interconnect includes a plurality of in-plane slits arranged in several rows. The in-plane slits may be spaced to provide strain relief without unduly increasing the electrical path resistance through the solar cell interconnect. The in-plane slits may be staggered, for example.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention relates to interconnects for electrically connecting solar cells. Embodiments of the present invention are especially beneficial for interconnecting back side contact solar cells, such as those disclosed in the following commonly-owned disclosures: U.S. patent application Ser. No. 10/633,188, filed on Aug. 1, 2003, entitled "Solar Cell Interconnect Structure" and U.S. patent application Ser. No. 11/140,460, filed on May 27, 2005, entitled "Interconnection of Solar Cells in a Solar Cell Module." The just mentioned disclosures are included in the aforementioned U.S. Provisional Application No. 60/840,166.

Figure 1:
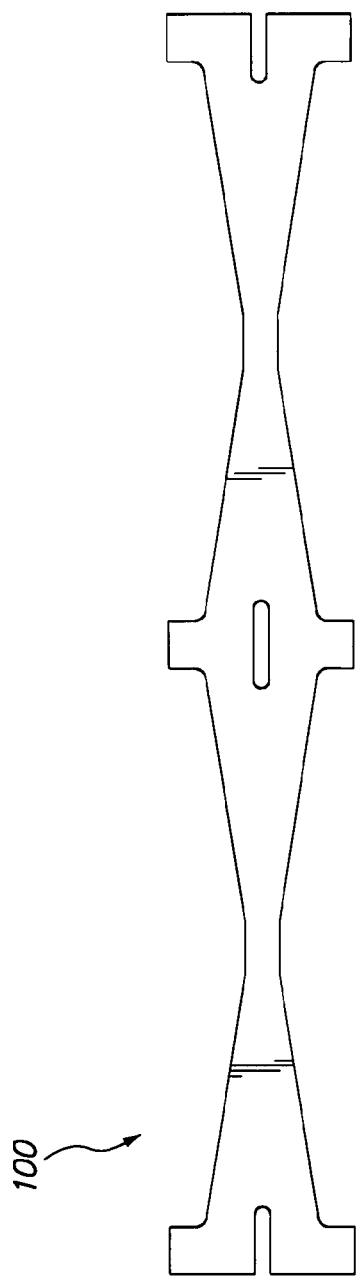
FIG. 1 shows an example continuous solar cell interconnect with a single in-plane slit in a middle portion for stress relief.

In U.S. patent application Ser. No. 10/633,188 ('188 application), separate interconnect leads are employed to electrically connect adjacent back side contact solar cells (e.g., see '188 application, interconnect lead 202A shown in FIGS. 6A and 6B). While this approach is more than adequate to electrically connect back side contact solar cells, there are applications where a single continuous interconnect may be more appropriate for its added structural integrity, ease of manufacturability, and redundant electrical connections between conductive areas. An example of such a continuous interconnect is disclosed in U.S. patent application Ser. No. 11/140,460 ('460 application). In the '460 application, a single, continuous interconnect attaches to multiple conductive areas of two adjacent solar cells (e.g., see '460 application, interconnect 210 shown in FIGS. 3(a) and 4). The single interconnect may have in-plane slits (e.g., see '460 application, slits 302 shown in FIGS. 3(a) and 4). The slits advantageously provide strain relief, which is particularly important in solar cell applications because solar cells may have thermal expansion coefficients that differ from encapsulation materials, such as glass. FIG. 1 shows a solar cell interconnect 100 similar to those disclosed in the '460 application.

An in-plane slit may be made larger to provide more strain relief. However, such a design would also lengthen the electrical path between adjacent solar cells, resulting in increased electrical resistance and thus efficiency loss. Providing a straight and direct electrical path between opposing tabs of an interconnect does not solve the problem because such a straight path essentially eliminates the strain relief. What is needed is an interconnect design that provides more strain relief without unduly lengthening the electrical path through the interconnect.

Figure 2:
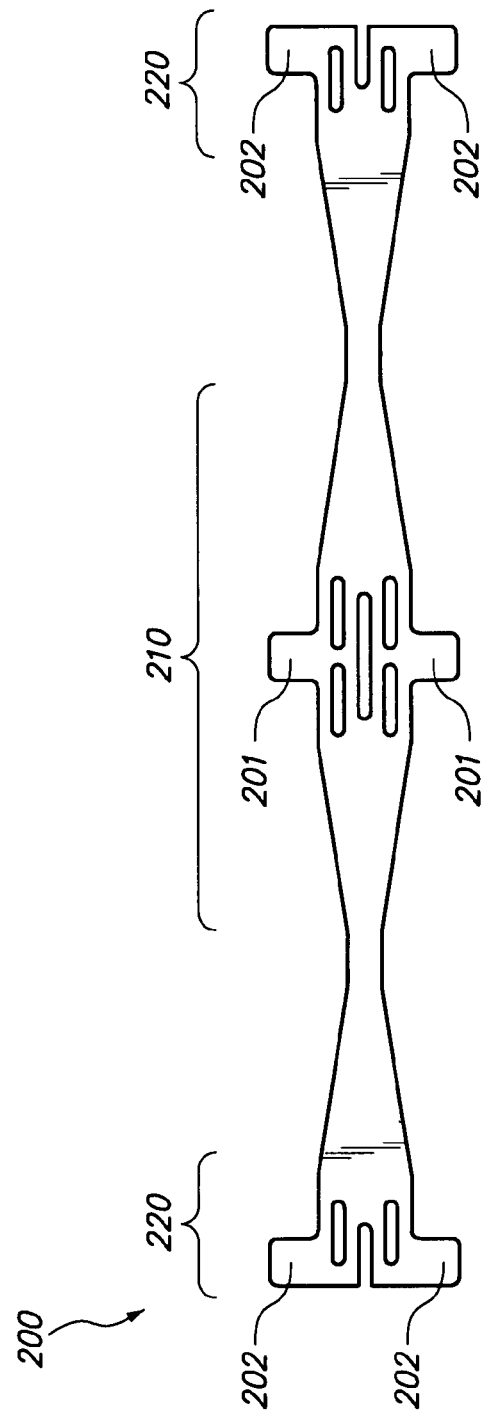
FIGS. 2, 4 and 6-10 show continuous solar cell interconnects in accordance with embodiments of the present invention.

FIG. 2 shows an interconnect 200 in accordance with an embodiment of the present invention. In the example of FIG. 2, the interconnect 200 includes a middle portion 210 and two end portions 220. Each portion of the interconnect 200 has tabs for connecting to conductive pads (also referred to as "contact points" or "conductive areas") of back side contact solar cells. The middle portion 210 has tabs 201, and the end portions 220 have tabs 202. Note that the each end portion 220 may mirror half of the middle portion 210, with appropriate adjustments in dimensions to match the dimensions of a conductive pad of a solar cell. Depending on the application, the middle and end portions may have different geometries and/or in-plane strain relief configurations to accommodate different pad designs.

Figure 4:
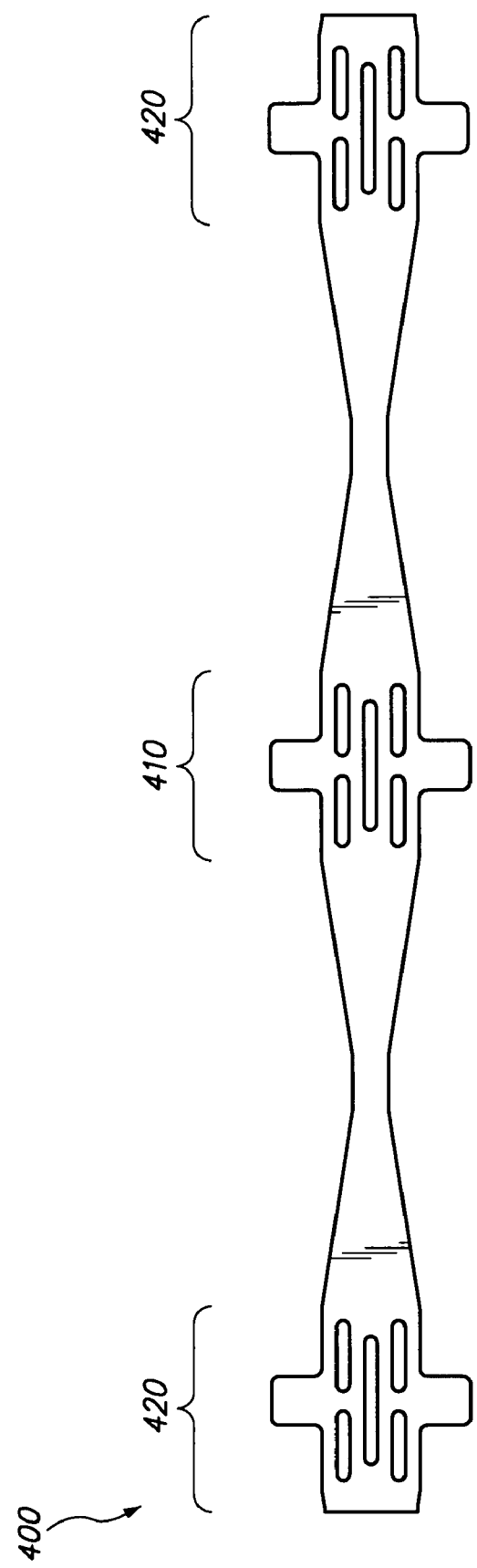

FIG. 4 shows an interconnect 400 in accordance with an embodiment of the present invention, where alternative end portions 420 are essentially the same as the middle portion 410. The interconnect 400 of FIG. 4 is an alternative embodiment with tapered (lobed) end portions 420. In the example of FIG. 4, the end portions 420 are essentially the same as the middle portion 410 but have a tapered edge. The end portions 420 have the same slit configuration as the middle portion 410.

As shown in FIG. 2, each portion of the interconnect 200 has in-plane (i.e., on the same plane as the interconnect) slits for strain relief. There are three parallel rows of slits in the middle portion 210: a single slit in the middle row, two slits in the top row, and two slits in the bottom row. In the example of FIG. 2, the slit in the middle row is made longer than those in the top and bottom rows, but does not extend past the outer ends of the slits in the top and bottom rows. The slits in the top and bottom rows add strain relief, advantageously allowing the slit in the middle row to be kept relatively short compared to conventional strain relieves. The staggered spacing of the slits allow electrical current to pass from the top tab 201 to the opposing bottom tab 201 between slits in the top and bottom rows and around the slit in the middle row. Making the slit in the middle row relatively short helps minimize electrical current path lengths between tabs; adding slits on the top and bottom rows helps increase strain relief to compensate for the relatively short slit in the middle row. As can be appreciated, this solution advantageously provides increased strain relief without unduly increasing electrical path resistance through the interconnect.

Figure 3:
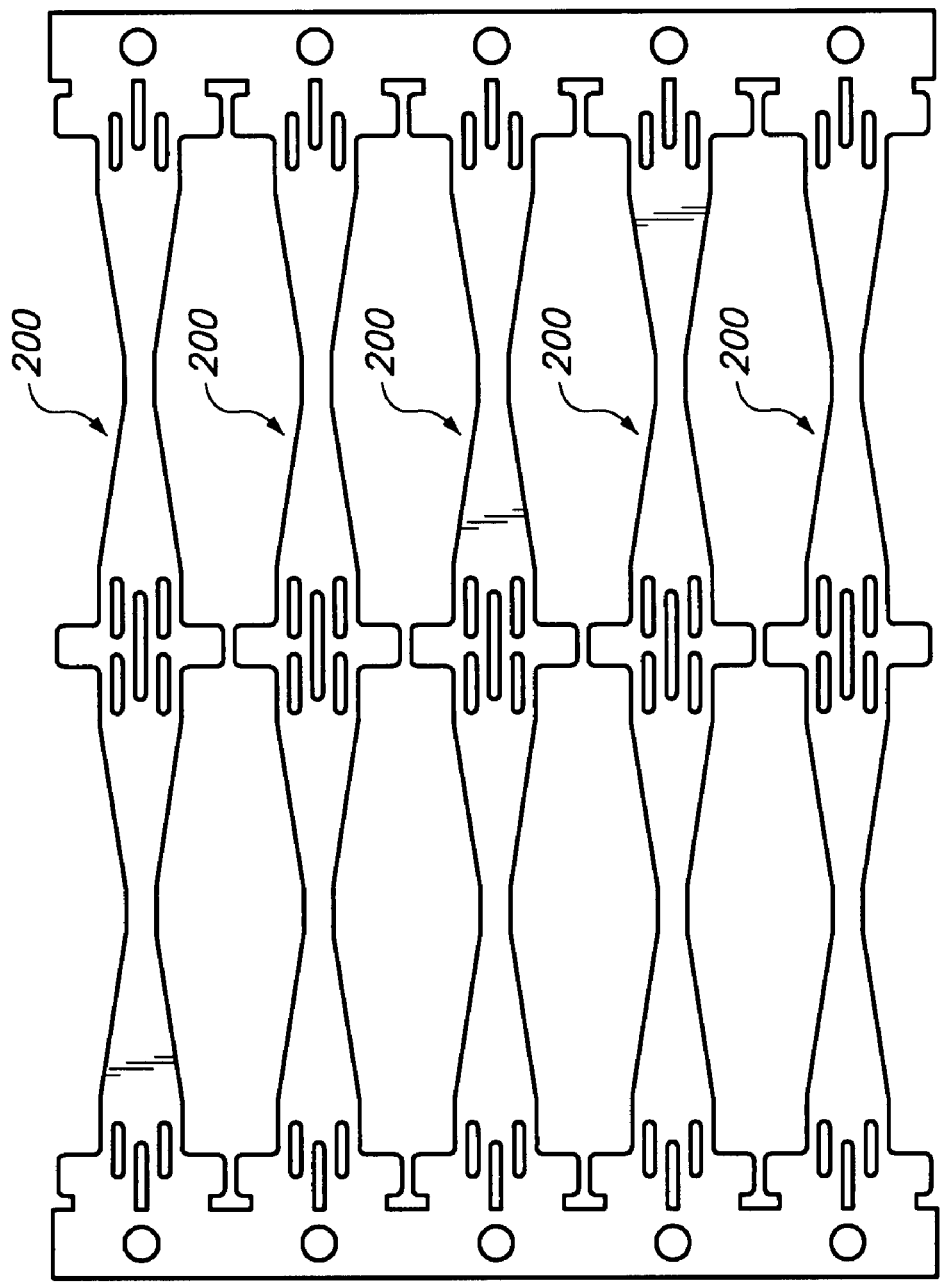
FIG. 3 shows how several solar cell interconnects may be manufactured as a stamped strip, in accordance with an embodiment of the present invention.

The design of the interconnect 200 not only provides superior strain relief compared to conventional solar cell interconnects, it also advantageously allows for low-cost manufacturing. FIG. 3 shows how several interconnects 200 may be made as a patterned strip (e.g., comprising copper) for low-cost, automated assembly. The interconnects 200 may be formed by stamping, chemical etching, EDM or other suitable manufacturing process without detracting from the merits of the present invention.

Figure 5:
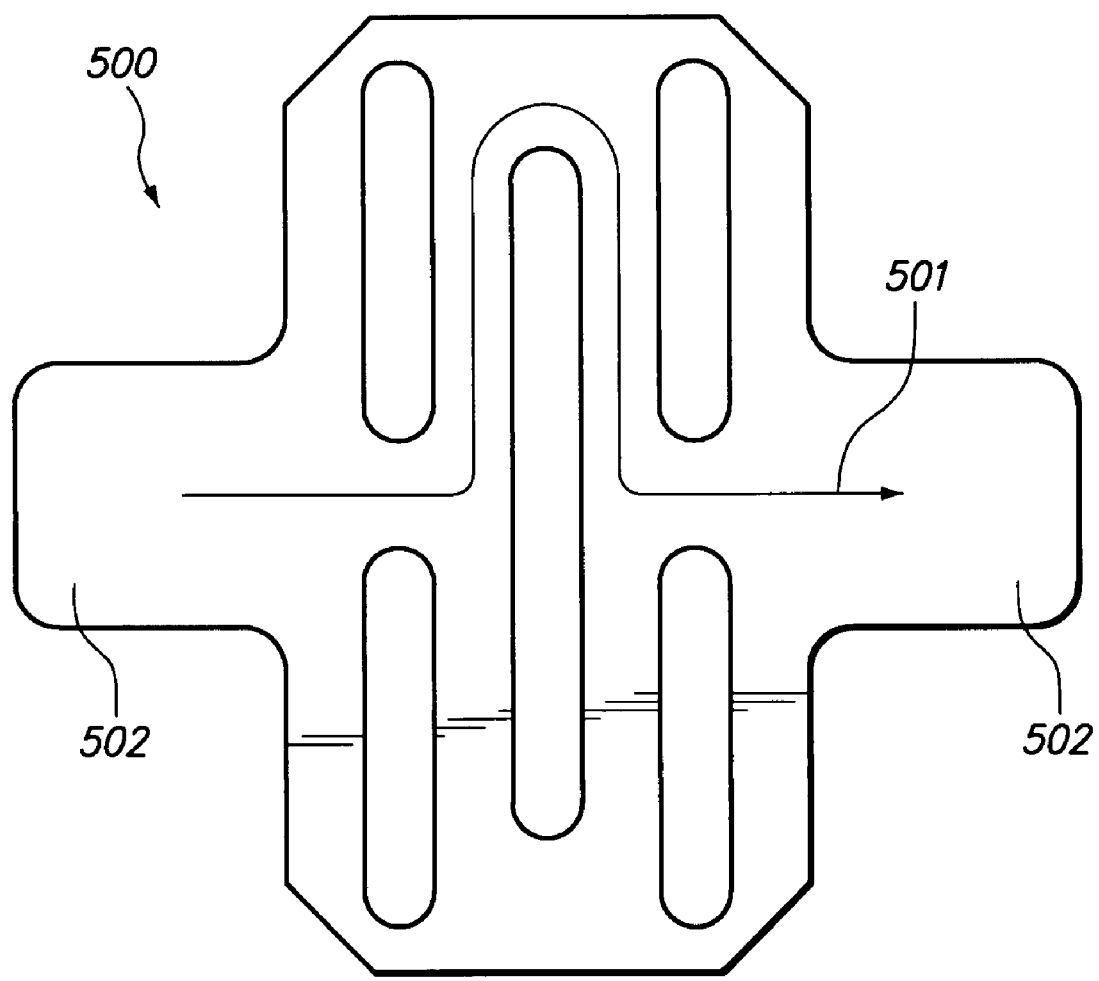
FIG. 5 shows a separate interconnect lead with strain relief features in accordance with an embodiment of the present invention.

FIG. 5 shows an alternative embodiment where a solar cell interconnect lead 500 is a separate interconnect lead (i.e., without end portions), as in the '188 application. Arrow 501 shows an example current path between opposing tabs 502. The interconnect lead 500 takes advantage of the in-plane strain relief arrangement of the continuous solar cell interconnect 200. As can be appreciated, if desired, a middle or end portion of any of the continuous solar cell interconnects disclosed herein may be employed as a separate interconnect lead. In contrast to a continuous interconnect, a separate interconnect lead only attaches to a single conductive pad on each of the adjacent solar cells. A separate interconnect lead, such as interconnect lead 500, may have a single continuous tab on each end as in FIG. 5, or two or more separate tabs on each end to meet the needs of particular applications.

FIGS. 6-10 show solar cell interconnects in alternative embodiments of the present invention. Note that the end portions of the interconnects of FIGS. 6-10 may have different slit designs than the middle portion as in the interconnect 200 of FIG. 2, or be copied versions of the middle portion as in the interconnect 400 of FIG. 4.

Figure 6:
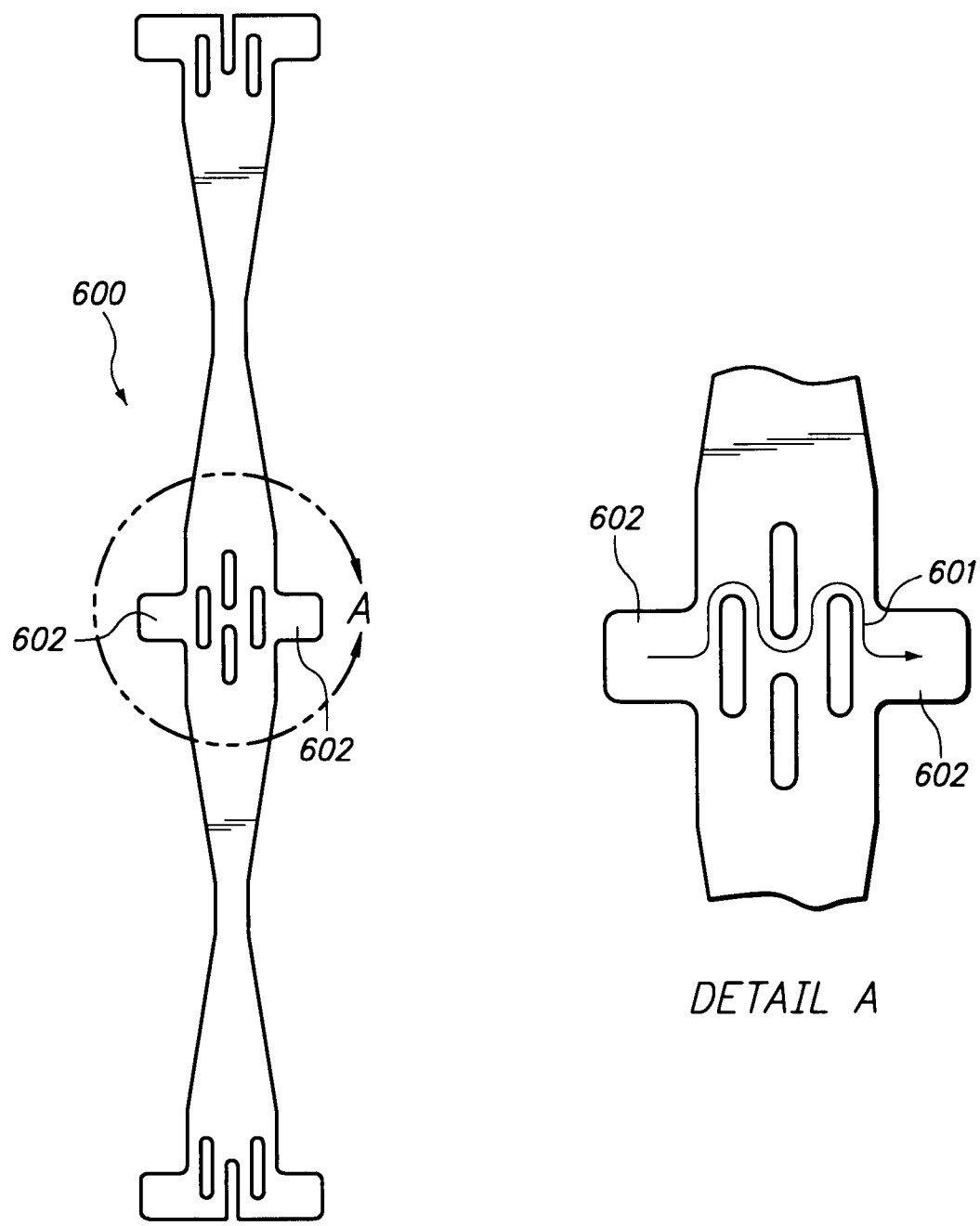

FIG. 6 shows an interconnect 600 where the middle row has two slits and the top and bottom rows each has a single slit. Detail A of FIG. 6 shows an enlarged view of the middle portion of the interconnect 600. Arrow 601 shows an example current path between opposing tabs 602.

Figure 7:
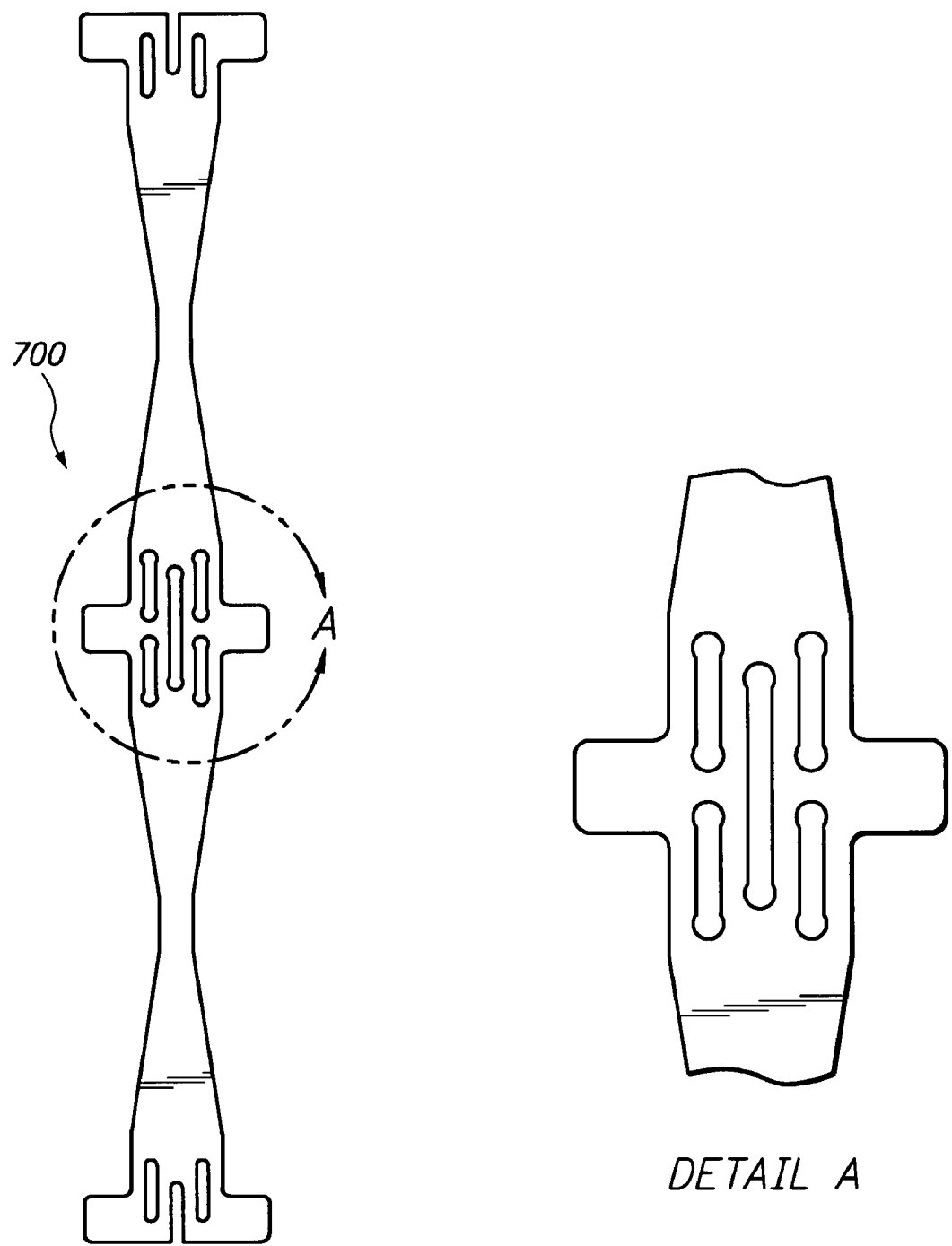

FIG. 7 shows an interconnect 700 that is similar to the interconnect 200 of FIG. 2 except for the keyholes at the ends of the slits. Detail A of FIG. 7 shows an enlarged view of the middle portion of the interconnect 700.

Figure 8:
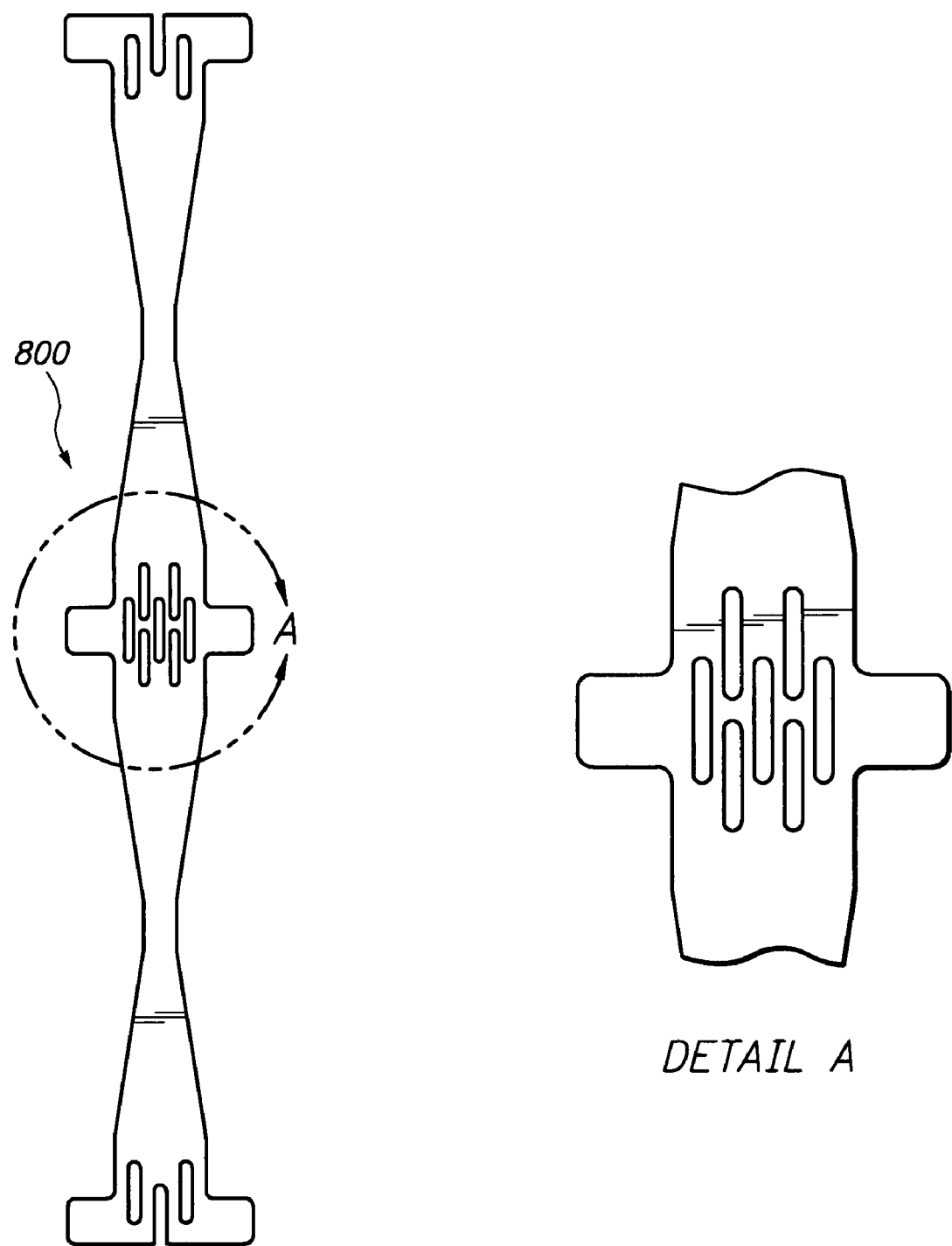

FIG. 8 shows an interconnect 800 with more than three rows of slits. Detail A of FIG. 8 shows an enlarged view of the middle portion of the interconnect 800.

Figure 9:
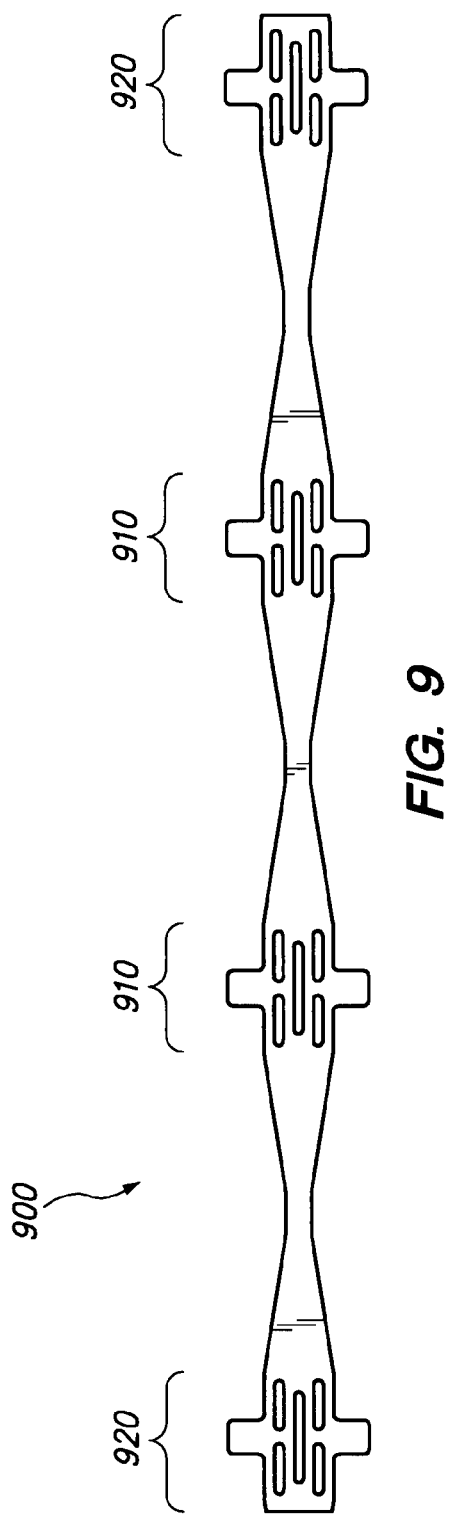

FIG. 9 shows an interconnect 900 with more than three portions. In the example of FIG. 9, there are two middle portions 910 and two end portions 920.

Figure 10:
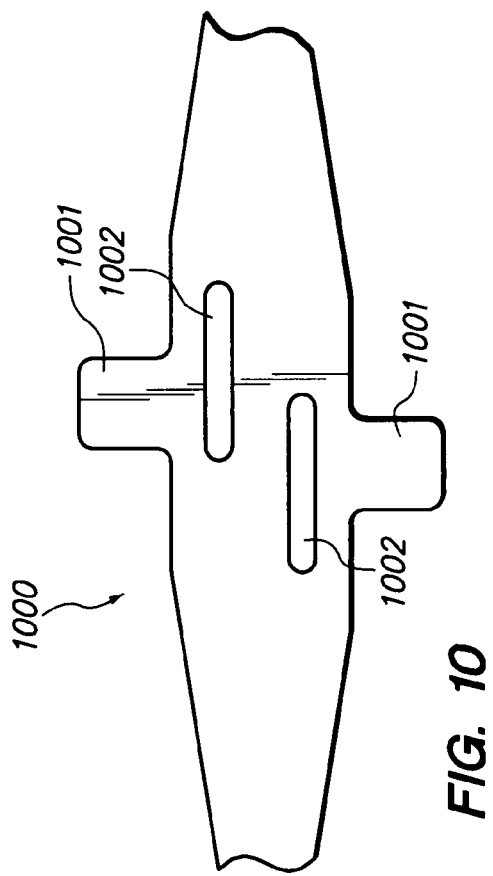

FIG. 10 shows an interconnect 1000 with offset tabs 1001 and two rows of offset slits 1002.

Figure 11:
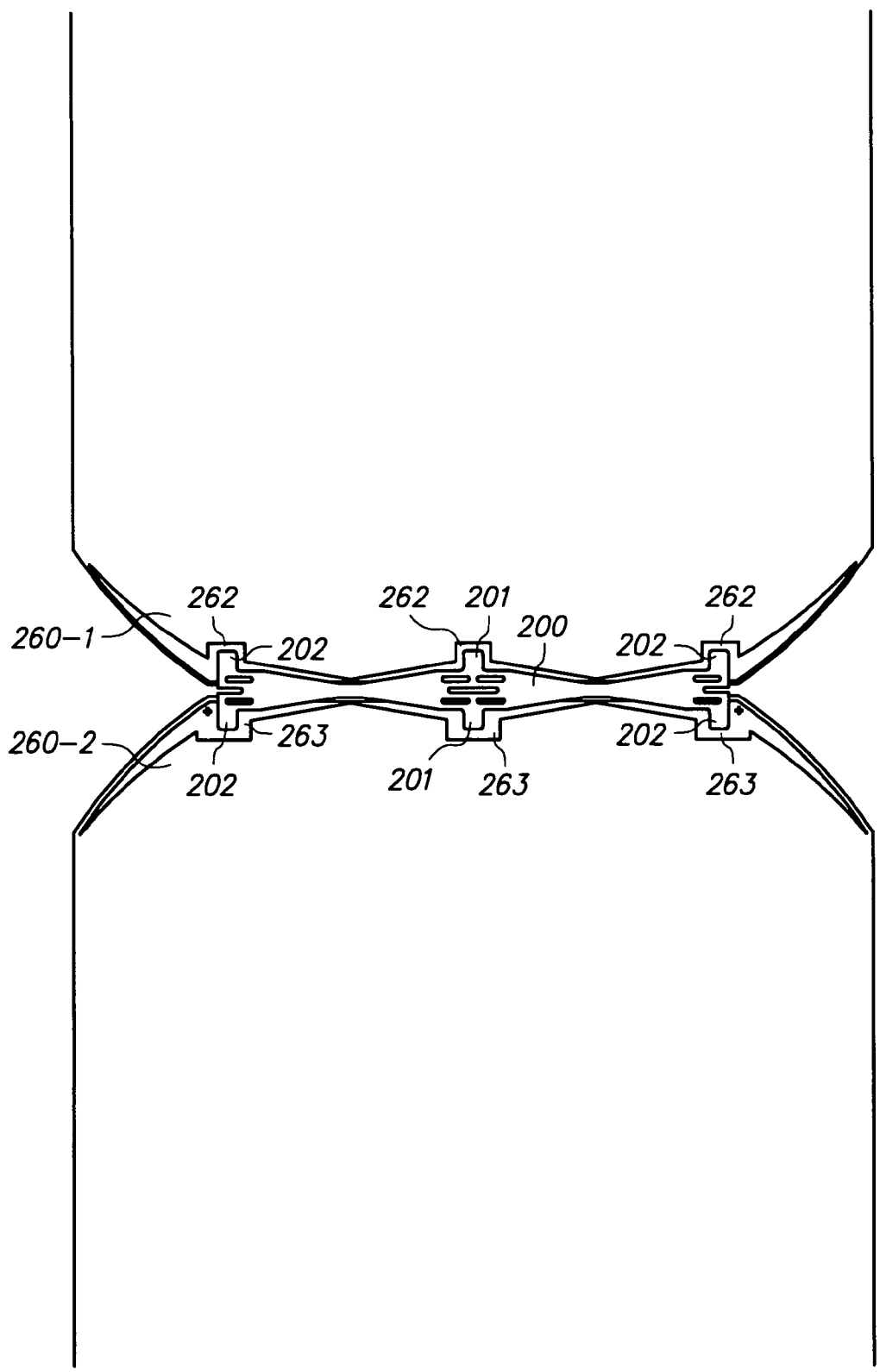
FIG. 11 shows a continuous interconnect electrically connecting adjacent back side contact solar cells, in accordance with an embodiment of the present invention.

FIG. 11 shows the continuous interconnect 200 electrically connecting adjacent back side contact solar cells 260-1 and 260-2. In the example of FIG. 11, tabs 202 and 201 of the interconnect 200 electrically connect positive pads 263 of the solar cell 260-2 to the negative pads 262 of the solar cell 260-1, on the back sides of the solar cells. As is well understood, the front side of a solar cell faces the sun to collect solar radiation during normal operation; the back side is opposite the front side.

Figure 12:
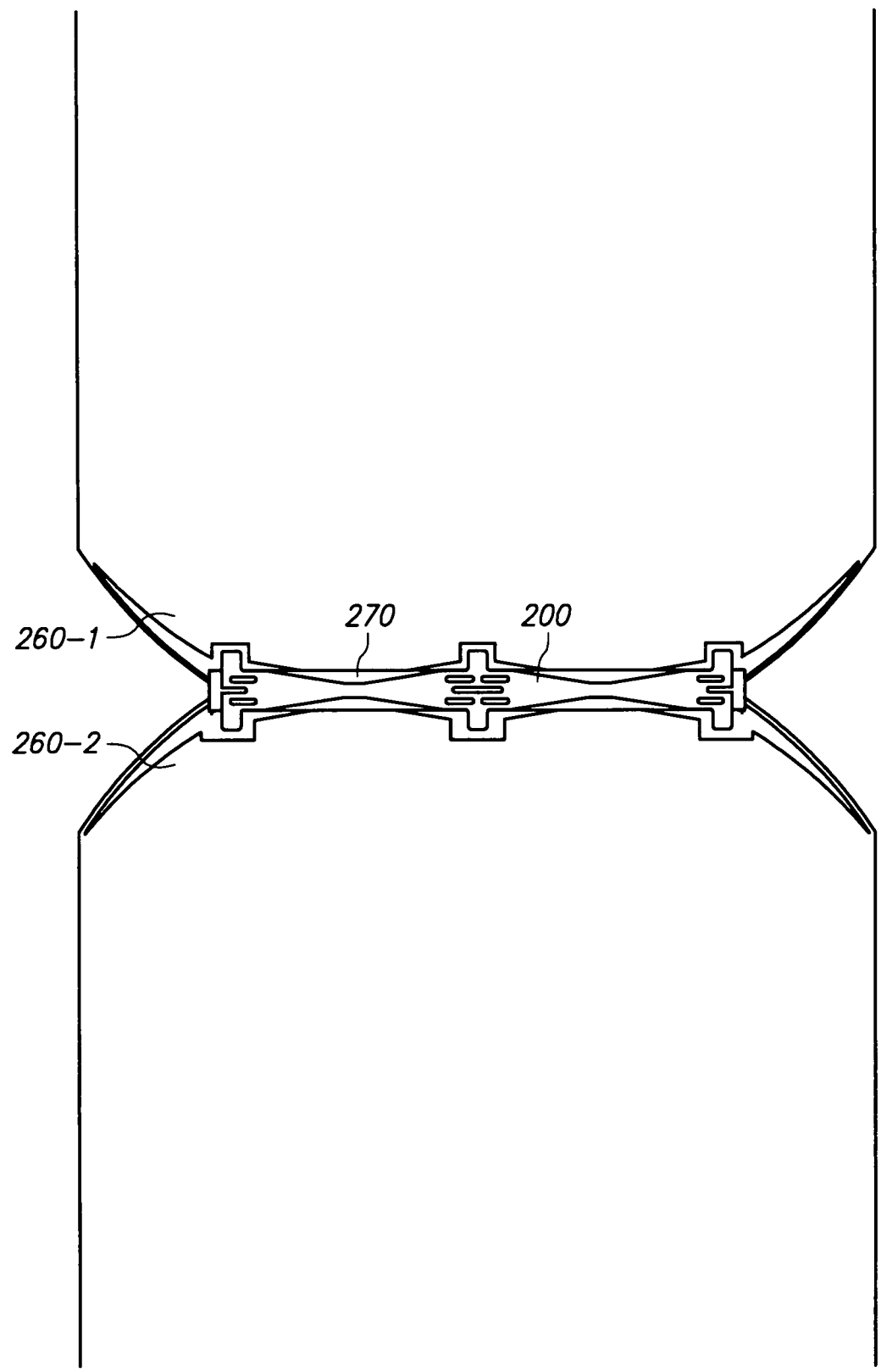
FIG. 12 shows the interconnect arrangement of FIG. 11 with an interconnect shield, in accordance with an embodiment of the present invention.

FIG. 12 shows the continuous interconnect 200 employed with an interconnect shield 270, as in the '460 application. Also shown in FIG. 12 are the back side contact solar cells 260-1 and 260-2 electrically connected by the continuous interconnect 200 as in FIG. 11. The interconnect shield 270 may be located between the interconnect 200 and the solar cells 260-1 and 260-2. The interconnect shield 270 may comprise a material that provides electrical insulation and can visually block the interconnect 200 as seen from the front side of the solar cells 260-1 and 260-2. Alternatively, instead of using a separate interconnect shield 270, the interconnect 200 may be printed or chemically treated to have a color that does not detract from the aesthetics of the solar cells 260-1 and 260-2 at least as viewed from the front side.

Solar cell interconnects with multiple current paths have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A continuous solar cell interconnect for electrically connecting two adjacent back side contact solar cells, the solar cell interconnect comprising:

a first portion having first and second tabs, the first tab being configured to electrically connect to a conductive pad of a first back side contact solar cell, the second tab being configured to electrically connect to a conductive pad of a second back side contact solar cell that is adjacent to the first back side contact solar cell, the first portion having an in-plane slit located in a first row, an in-plane slit located in a second row, and an in-plane slit located in a third row having first and second opposite ends, the third row being between the first and second rows, the in-plane slit in the third row being staggered with the in-plane slits in the first and second rows to form a first electrical current path that goes from the first tab, around the first end of the in-plane slit in the third row, and to the second tab, and a second electrical current path that goes from the first tab, around the second end of the in-plane slit in the third row, and to the second tab, the first and second electrical current paths being divergent electrical current paths; and a second portion having third and fourth tabs, the third tab being configured to electrically connect to a conductive pad of the first back side contact solar cell, the fourth tab being configured to electrically connect to a conductive pad of the second back side contact solar cell;

wherein the solar cell interconnect has a solid plane between the first and second portions.

2. The solar cell interconnect of claim 1 further comprising:

a third portion having fifth and sixth tabs, the fifth tab being configured to electrically connect to a conductive pad of the first back side contact solar cell, the sixth tab being configured to electrically connect to a conductive pad of the second back side contact solar cell.

3. The solar cell interconnect of claim 1 wherein the first and second tabs are located on opposite sides of the solar cell interconnect.

4. The solar cell interconnect of claim 1 wherein there are two in-plane slits in the first and second rows and a single in-plane slit in the third row.

5. The solar cell interconnect of claim 1 wherein the first and second tabs are offset relative to each other.

6. The solar cell interconnect of claim 1 wherein the second portion is configured to mirror half of the first portion.

7. The solar cell interconnect of claim 1 further comprising an interconnect shield between the first and second back side contact solar cells and the solar cell interconnect, the interconnect shield comprising a material that visually blocks the interconnects as seen from a front side of the first and second back side contact solar cells.

* * * * *